United States Patent
Boeck et al.

(10) Patent No.: US 6,770,953 B2
(45) Date of Patent: Aug. 3, 2004

(54) BIPOLAR TRANSISTOR (75) Inventors: Josef Boeck, Munich (DE); Klaus Aufinger, Ottobrunn (DE); Markus Zeiler, Nittendorf-Undorf (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/182,582

(22) PCT Filed: Jan. 24, 2001

(86) PCT No.: PCT/EP01/00745
§ 371 (c)(1),
(2), (4) Date: Jul. 31, 2002

(87) PCT Pub. No.: WO01/57916
PCT Pub. Date: Aug. 9, 2001

(65) Prior Publication Data
US 2003/0052387 A1 Mar. 20, 2003

(30) Foreign Application Priority Data
Jan. 31, 2000 (DE) ......................... 100 04 111

(51) Int. Cl.$^7$ .............................................. H01L 27/02
(52) U.S. Cl. ....................... 257/578; 257/557; 257/563; 257/564; 257/560; 257/593
(58) Field of Search ................................ 257/578, 579, 257/588, 557, 563, 564, 554, 560, 593, 575

(56) References Cited

U.S. PATENT DOCUMENTS

| | | |
|---|---|---|
| 3,922,706 A | 11/1975 | Kaiser |
| 4,680,608 A | 7/1987 | Tsuzuki et al. |
| 5,341,020 A | 8/1994 | Sasahara |
| 5,455,186 A | 10/1995 | Inn |
| 5,455,449 A | 10/1995 | Inn |
| 5,675,175 A | 10/1997 | Iranmanesh |
| 6,235,601 B1 * | 5/2001 | Kim ........................... 438/348 |
| 6,303,973 B1 * | 10/2001 | Nakagawa et al. ......... 257/565 |

FOREIGN PATENT DOCUMENTS

| | | |
|---|---|---|
| DE | 1 281 036 | 10/1968 |
| EP | 0 608 999 | 8/1994 |

OTHER PUBLICATIONS

*Patent Abstracts of Japan* for JP 61029173 of Feb. 10, 1986.
*Patent Abstracts of Japan* for JP 5–218056 of Aug. 27, 1993, E–1470, Dec. 6, 1993, vol. 17, No. 657.

* cited by examiner

Primary Examiner—Jerome Jackson
Assistant Examiner—Matthew Landau
(74) Attorney, Agent, or Firm—Schiff Hardin LLP (57) ABSTRACT A bipolar transistor is provided in which the product of base-collector capacitance and collector resistance can be reduced through a layout optimization, which leads to an improvement of the critical transistor parameters. The bipolar transistor has an emitter formed from a plurality of emitter elements, a plurality of base contacts and a plurality of collector contacts, these elements being provided in a specific arrangement with respect to one another for the formation of the transistor layout. The invention provides for the emitter to have at least one closed emitter configuration, the at least one emitter configuration bounding at least one emitter inner space, which can in turn be divided into a plurality of partial spaces. At least one of the base contacts is arranged in the emitter inner space, while at least one other base contact and the collector contacts are arranged outside the emitter configuration.

15 Claims, 5 Drawing Sheets

FIG 1

PRIOR ART

BIPOLAR TRANSISTOR

BACKGROUND OF THE INVENTION

1. Field of the Invention

The present invention relates to a bipolar transistor.

2. Description of the Related Art

Bipolar transistors are generally constructed from two pn junctions lying close together in a semiconductor crystal. In this case, either two n-doped regions are separated from one another by a p-doped region (npn transistors) or two p-doped regions by an n-doped region (pnp transistors). The three differently doped regions are referred to as emitter (E), base (B) and collector (C). Bipolar transistors are well known and are used in diverse ways. In the case of bipolar transistors, a distinction is made between "individual" transistors, which are intended for mounting on printed circuit boards and are accommodated in a dedicated housing, and "integrated" transistors, which are fabricated together with further semiconductor components on a common semiconductor carrier, generally referred to as "substrate".

In addition to the transition frequency of the bipolar transistor, which is one of its limiting frequencies, the base resistance and the base-collector capacitance are critical transistor parameters which determine important characteristic quantities such as the maximum oscillation frequency, the power gain, the minimum noise figure, the gate delay times and the like.

Thus, for example, the following holds true to an approximation:

$$f_{max} = \sqrt{\frac{f_T}{8\pi \times R_B \times C_{BC}}}$$

where $f_{max}$ designates the maximum oscillation frequency, $f_T$ designates the transition frequency, $R_B$ designates the base resistance and $C_{BC}$ designates the base-collector capacitance.

The transition frequency is essentially determined by the dopant profile in the active transistor region. By contrast, the product $R_B*C_{BC}$ can be influenced by the transistor layout (i.e., the geometrical construction).

Figure 1:
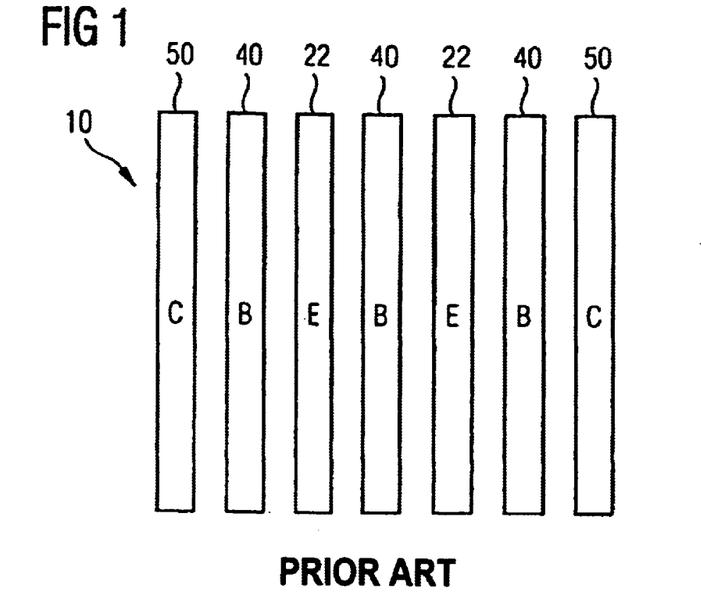
FIG. 1 is a diagrammatic layout of a bipolar transistor known from the prior art.

In the case of previously known bipolar transistors, for example so-called silicon microwave transistors, generally a transistor layout as illustrated diagrammatically in FIG. 1 is used. Such bipolar transistors have at least one emitter formed from one or more emitter elements, one or more base contact(s) and one or more collector contact(s). In this case, the at least one emitter, the at least one base contact and the at least one collector contact are provided in a specific arrangement with respect to one another for the formation of the transistor layout.

As is illustrated in FIG. 1, the emitter (E) can be embodied in strip form, the emitter strip width being given by the minimum possible lithography width. This leads to a smallest possible internal base bulk resistance. In order to minimize the total base resistance, each emitter strip is surrounded by two base connection strips (B). Two emitter strips are usually used, so that only three (instead of four) base strips are required, since the middle base contact can be used for both emitter strips. The collector contacts (C) are embodied beside the outer base contacts.

The transistor layout described can yield the minimum possible resistance for a given minimum lithography width.

The base resistance can be reduced by lengthening the emitter strips, since the base resistance $R_B$ is proportional to $1/I_e$, where $I_e$ is equal to the emitter length. It is the case, however, that the base-collector capacitance $C_{BC}$ is proportional to the emitter length $I_e$, so that the product $R_B*C_{BC}$ is to a first approximation independent of the emitter length $I_e$.

In the case of the known bipolar transistors, the total emitter area is chosen in such a way as to produce the current respectively desired in the application of the bipolar transistors.

Such known bipolar transistors can be used for example for the "self-aligned dual polysilicon technology".

SUMMARY OF THE INVENTION

Taking the known prior art as a departure point, the present invention is based on the object of providing a bipolar transistor which, with regard to its transistor parameters, has an optimized transistor layout in relation to the known solutions.

This object is achieved according to the invention by means of a bipolar transistor, having at least one emitter formed from one or more emitter elements, having one or more base contact(s) and having one or more collector contact(s), the at least one emitter, the at least one base contact and the at least one collector contact being provided in a specific arrangement with respect to one another for the formation of the transistor layout. According to the invention, the bipolar transistor is characterized in that the emitter has at least one closed emitter configuration, in that the at least one emitter configuration bounds at least one emitter inner space, in that two or more base contacts are provided, in that at least one of the base contacts is arranged in the emitter inner space, and in that the at least one other base contact and also the at least one collector contact are arranged outside the emitter configuration.

In this way, it is possible to obtain an optimized transistor construction which, given the same design rules (i.e., the same requirements made of the technology generation), enables a significantly smaller product $R_B*C_{BC}$ than in the case of the transistor layouts customarily used previously, as are illustrated in FIG. 1, for example, and described further above. As a result, the properties of the bipolar transistor are improved. In particular, by virtue of the bipolar transistor according to the invention, significantly improved RF (radio frequency) properties of these transistors can be made possible, such as higher transition and maximum oscillation frequencies and a smaller noise figure.

An important difference of the bipolar transistor according to the invention in comparison with the bipolar transistors known in the prior art is that a solution for the minimum base resistance $R_B$ is not chosen, but rather that the product $R_B*C_{BC}$ is optimized in a targeted manner. Although, as will be explained in greater detail below, this can lead to slightly higher values for $R_B$, distinctly lower values are nonetheless achieved for the base-collector capacitance $C_{BC}$.

In contrast to the previously known transistor layout, the inventive emitter is embodied in such a way that it has at least one closed emitter configuration. This means that the emitter has at least one continuous component, this continuous component bounding or surrounding at least one emitter inner space. At least one base contact may be situated within this emitter inner space.

The invention is not restricted to specific configurational forms for the emitter configuration according to the invention. A number of non-exclusive exemplary embodiments are explained in more detail in connection with the description of the figures.

Preferred embodiments of the bipolar transistor according to the invention are described below.

The emitter configuration may advantageously have two or more emitter elements which are connected to one another to form the closed emitter configuration.

To that end, the emitter configuration may, for example, have two or more strip-type emitter elements which are oriented in parallel and spaced apart with respect to one another. Furthermore, the strip-type emitter elements may be connected to one another at their free ends in each case via an emitter element formed as an outer emitter web. If more than two strip-type emitter elements are used for the emitter configuration, the outer emitter web may comprise a corresponding number of individual constituent parts, the totality of which then forms the outer emitter web. In contrast to the known transistor layout, the emitter is now no longer embodied only in strip form, rather the two emitter strips are connected by intermediate webs.

In a further refinement, at least one further, inner emitter web which connects the two strip-type emitter elements may be provided between the two outer emitter webs, via which inner emitter web the emitter inner space is subdivided into two or more partial spaces. In such a refinement, with the use of only a single inner emitter web, the emitter configuration thus diagrammatically has the form of an "eight" in plan view. The invention is not limited to a specific number of inner emitter webs. When a plurality of strip-type emitter elements are used, the inner emitter web(s) can in turn be formed from a corresponding number of emitter web constituent parts.

Base contacts may in each case be placed between the individual emitter webs. This means that these base contacts may advantageously be arranged in one or more of the partial spaces.

The length of the outer and optionally the inner emitter webs—and thus the distance between the strip-type emitter elements—is preferably chosen to be as small as is allowed by the design rules for the minimum possible size of the base contacts.

The emitter may preferably have two or more closed emitter configurations.

In an advantageous manner, at least two strip-type base contacts and/or two strip-type collector contacts may be provided outside the emitter configuration.

The strip-type base contacts may be oriented parallel and spaced apart with respect to the outer emitter webs.

By contrast, the strip-type collector contacts may be oriented parallel and spaced apart with respect to the strip-type emitter elements.

The advantages of such an orientation of the base contacts and/or collector contacts are explained in more detail below.

The at least one emitter may preferably be connected or be able to be connected in a first metalization plane.

In a further refinement, the at least one base contact may be led or be able to be led into a second metalization plane lying parallel and spatially spaced apart relative to the first metalization plane.

This will be illustrated using an example. If the emitter is connected in the first metalization plane, for example, the base contacts can be led upward into the second metalization plane and, in the latter, then be led via the emitter webs to the respective contact regions at the top and bottom. The use of two such wiring planes does not constitute an additional outlay in comparison with the known bipolar transistor types, because in the latter, too, two metalization planes are required in order to make contact with the emitter, the base and the collector and in order to produce a connection to the so-called bonding pads.

The base connection may preferably be effected between the at least one emitter and the at least one collector contact via a base polysilicon material. Such a base connection has the function of the control electrode in the bipolar transistor. The base connection can control the current from the emitter to the collector, this current being referred to as the transfer current. In the bipolar transistor configuration according to the invention, a dedicated base contact is no longer present between the emitter and the at least one collector contact, in contrast to what was the case in the bipolar transistor types known from the prior art. On the side between the emitter and the collector contact, the base connection is therefore now effected via the base polysilicon material.

This material may particularly advantageously be embodied as silicide. The bipolar transistor can thus be embodied in a particularly efficient manner. With the use of silicide, the sheet resistance is so low in comparison with polysilicon that a low-resistance base connection can be realized between emitter and collector contact even without a close metal contact.

In comparison with the previously known transistor design (see FIG. 1) with an emitter area of the same size (i.e., with the same current yield) the bipolar transistor according to the invention leads to a significantly more compact arrangement and thus to a significantly smaller base-collector capacitance $C_{BC}$. Moreover, the collector resistance $R_C$ is significantly reduced, because the emitter and collector contact are no longer separated from one another by a base contact. With the same design rules, the transistor area can be reduced by about 40% through the layout optimization.

In order to appraise the influence of the implemented layout measure in the bipolar transistor according to the invention on the base resistance $R_B$ and the base-collector capacitance $C_{BC}$, various simulation tests were carried out. The results of these simulations are presented in Table 1 below:

TABLE 1

| Type | $R_B$ [Ω] | $C_{BC}$ [fF] | $R_B*C_{BC}$ [fs] |
|---|---|---|---|
| Standard | 22.1 | 37.3 | 824 |
| Standard siliconized | 20.8 | 37.3 | 776 |
| New layout | 25.2 | 23.8 | 600 |
| New layout siliconized | 21.2 | 23.8 | 505 |

Table 1 shows calculated values for the base resistance $R_B$, the base-collector capacitance $C_{BC}$ and the product $R_B*C_{BC}$. The values were calculated for any transistor design as known from the prior art and a transistor design optimized in accordance with the invention, for a transistor with an emitter mask area of 10 $\mu m^2$. In Table 1, the results are shown for a configuration known in the prior art, which is designated by "standard", a configuration known from the prior art with siliconized base polysilicon, which is designated as "standard siliconized", an optimized configuration according to the present invention, which is designated as "new layout", and a configuration according to the invention with siliconized base polysilicon, which is designated as "new layout siliconized".

Without silicide, the use of the bipolar transistor layout according to the invention leads to a reduction of the product value $R_B*C_{BC}$ by 27% in comparison with the transistor layout known from the prior art. If silicide is used in each case, the advantage is even greater, with a reduction by 35%.

In summary, the following advantages can be achieved, inter alia, by virtue of the bipolar transistor layout according to the invention. Firstly, the product $R_B*C_{BC}$ can be significantly reduced. Furthermore, it is also possible to reduce the collector resistance $R_C$. Moreover, the bipolar transistor according to the invention enables higher transition frequencies, higher maximum oscillation frequencies and smaller noise figures. Furthermore, the collector-substrate capacitance and thus also the power consumption can be reduced. In addition, the bipolar transistors according to the invention need a smaller space requirement, so that more transistors can be fabricated per area, which leads to lower fabrication costs. The advantages that can be obtained can be realized through what is purely a layout measure, so that they are completely cost-neutral. Additional process modules are not necessary. Finally, the bipolar transistors according to the invention are highly universal, i.e., they can be used for all bipolar technologies, thus enveloping a large market volume.

In a particularly advantageous manner, a bipolar transistor according to the invention as described above can be used as a microwave transistor. However, the invention is not restricted to these bipolar transistor types, so that it can also be applied to all other bipolar transistors in integrated circuits.

DESCRIPTION OF THE DRAWINGS

The invention is explained in more detail using exemplary embodiments with reference to the accompanying drawings.

DETAILED DESCRIPTION OF THE INVENTION

FIG. 1 illustrates a bipolar transistor 10 in the form of a discrete silicon microwave transistor. The bipolar transistor 10 has a layout known from the prior art.

The bipolar transistor 10 has an emitter (E) formed from two strip-type emitter elements 22. The width of the respective emitter strips 22 is given by the minimum possible lithography width. In order to minimize the total base resistance $R_B$ of the bipolar transistor 10, each strip-type emitter element 22 is flanked by two strip-type base contacts (B) 40. In the exemplary embodiment in accordance with FIG. 1, two strip-type emitter elements 22 are used, so that only three, instead of four, strip-type base contacts 40 are required, since the middle base contact can be used for both emitter elements 22. Two strip-type collector contacts (C) 50 are in each case embodied beside the outer base contacts 40.

Figure 2:
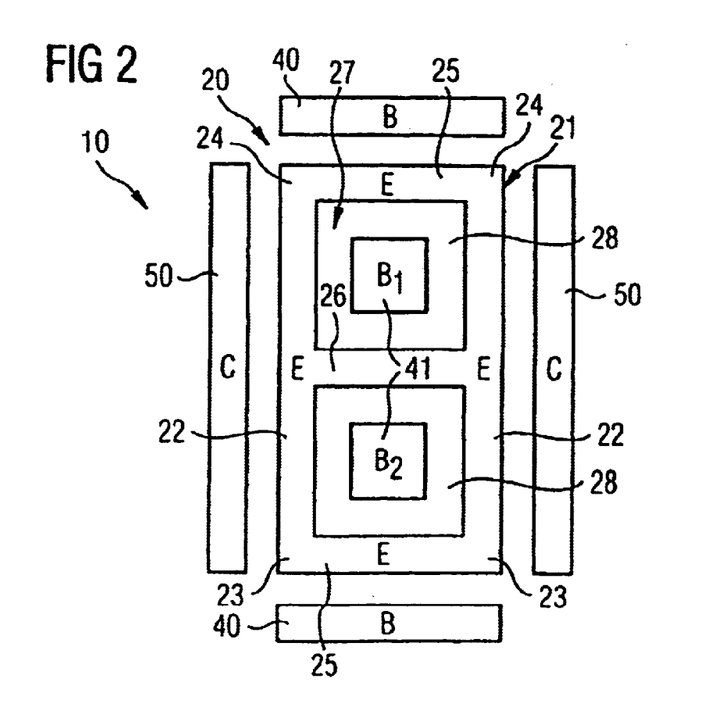
FIG. 2 is a diagrammatic layout of a first embodiment of an optimized transistor arrangement according to the present invention.

In order to optimize this bipolar transistor layout in a manner that has been explained in detail above, the invention provides a layout for the bipolar transistor 10 according to FIG. 2.

The bipolar transistor 10 has an emitter (E) 20 formed from two strip-type emitter elements 22. The two strip-type emitter elements 22 are oriented parallel and spaced apart with respect to one another. The strip-type emitter elements 22 are connected to one another at their free ends 23, 24 in each case via an outer emitter web 25. This results in an emitter 20 with a closed emitter configuration 21, the emitter configuration 21 bounding or surrounding an emitter inner space 27.

A further, inner emitter web 26 which connects the two strip-type emitter elements 22 is provided between the two outer emitter webs 25. The emitter inner space 27 is subdivided into two partial spaces 28 via this additional inner emitter web 26. The emitter 20 thus diagrammatically has the form of an "eight" in plan view.

Base contacts (B1, B2) 41 are placed between the emitter webs 25, 26, i.e., into the partial spaces 28. The distance between the two strip-type emitter elements 22, i.e., the length of the outer and inner emitter webs 25, 26, is chosen to be as small as is permitted by the design rules for the minimum possible size of the base contacts 41 situated in the partial spaces 28.

Outside the closed emitter configuration 21, two strip-type base contacts (B) 40 are provided in parallel and spaced apart with respect to the outer emitter webs 25. Furthermore, two strip-type collector contacts (C) 50 are provided parallel and spaced apart with respect to the strip-type emitter elements 22 outside the closed emitter configuration 21.

The emitter 20 is connected in a first metalization plane. The base contacts 40, 41 are led upward in a second metalization plane and, in the latter, can then be led via the emitter webs 25, 26 to the respective contact regions at the top and bottom.

Comparing FIG. 1 and FIG. 2, in the case of the bipolar transistor layout according to the invention as illustrated in FIG. 2, a dedicated base contact is now no longer present between the emitter 20 and the collector contacts 50. At this location, the base connection 42 is therefore effected via base polysilicon material, which is particularly preferably embodied as silicide.

In comparison with the layout illustrated in FIG. 1, for an emitter area of the same size, i.e., for the same current yield, the exemplary embodiment of the bipolar transistor according to the invention which is illustrated in FIG. 2 leads to a significantly more compact arrangement and thus to a smaller base-collector capacitance. Moreover, the collector resistance is significantly reduced because emitter 20 and collector contact 50 are no longer separated from one another by a base contact.

Figure 6A:
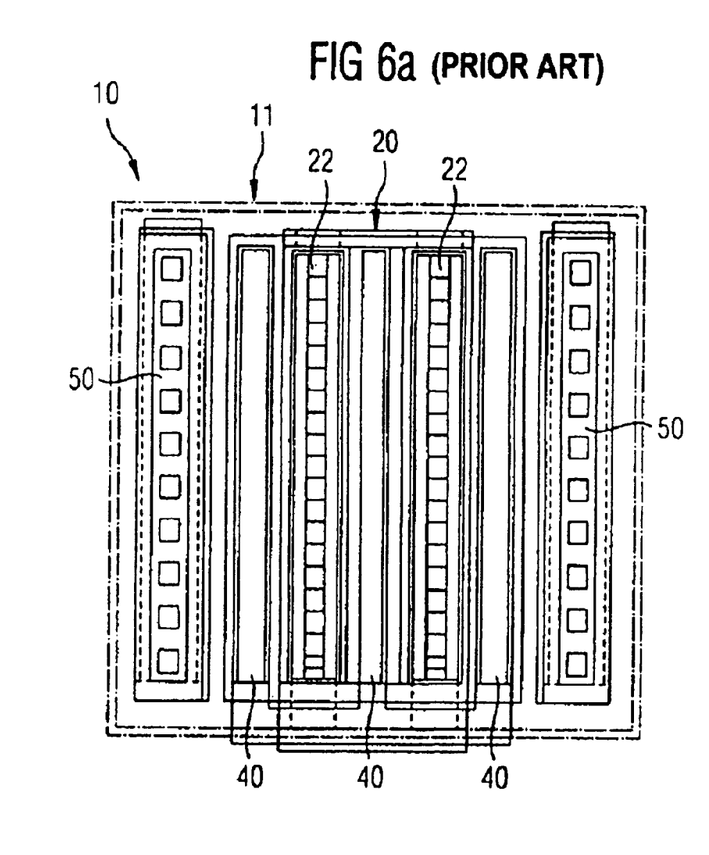
FIGS. 6a and 6b are diagrammatic layouts showing a true to scale size comparison for a transistor known from the prior art in accordance with FIG. 1 (FIG. 6a) and a transistor with optimized layout according to the present invention in accordance with FIG. 2 (FIG. 6b), given the same emitter area (i.e., given the same current yield).
Figure 6B:
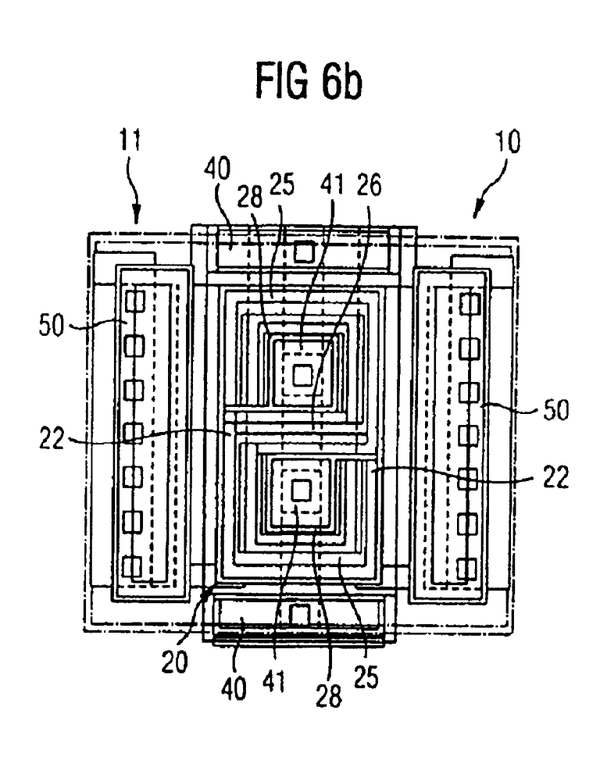

The scope of the possible space saving as a result of the bipolar transistor layout according to the invention can be seen from FIGS. 6a and 6b. These two figures show a true to scale comparison for the layout of a bipolar transistor 10 known from the prior art, as is illustrated in FIG. 1. This layout is shown in FIG. 6a. FIG. 6b shows the layout of a bipolar transistor 10 according to the invention, as is described and illustrated in FIG. 2.

As emerges from the direct comparison between FIGS. 6a and 6b, given the same design rules, the transistor area can be reduced by about 40% through a layout optimization for emitter areas that are in each case of the same size.

Figure 3:
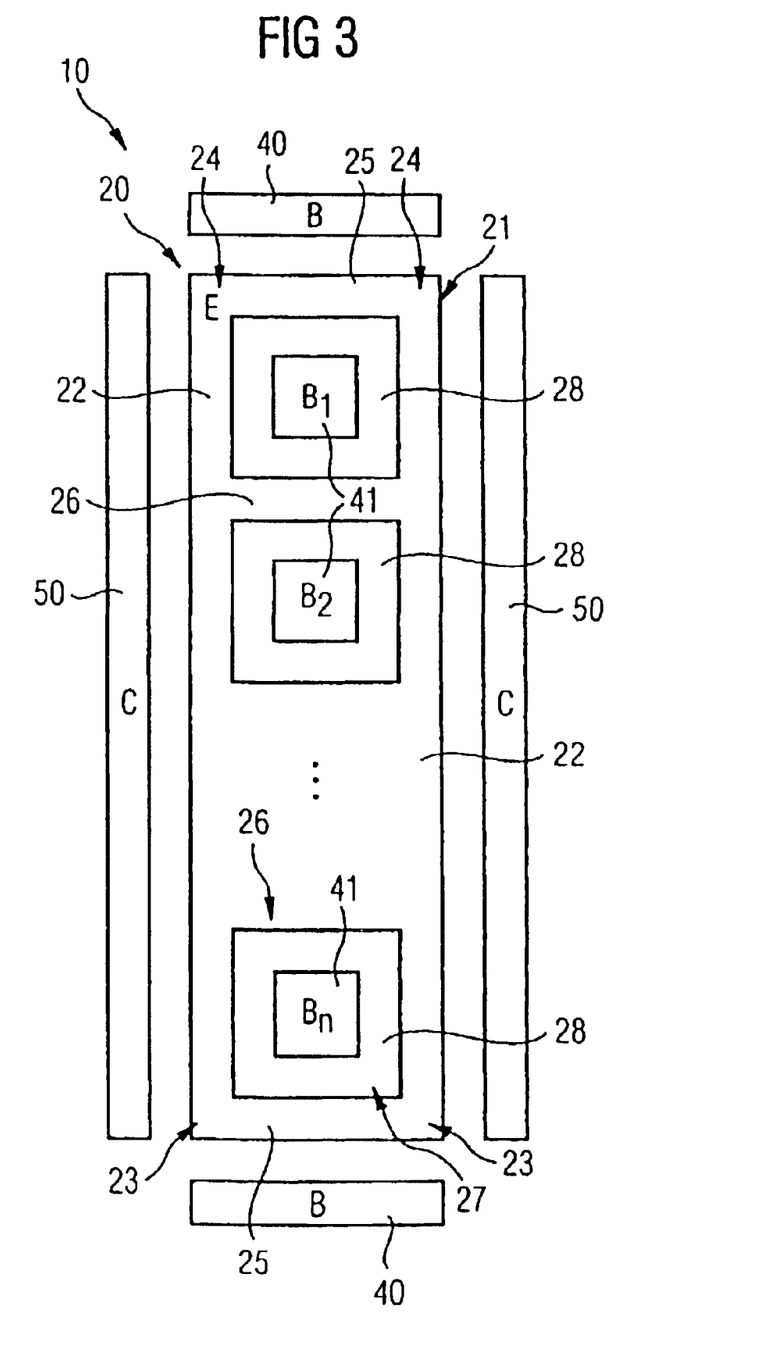
FIG. 3 is a diagrammatic layout of a further embodiment of an optimized transistor arrangement according to the present invention.

FIG. 3 illustrates another embodiment of a bipolar transistor 10 with an optimized transistor layout. In terms of its basic construction and also with regard to the flanking by in each case two strip-type base contacts 40 and collector contacts 50, the emitter 20 illustrated in FIG. 3 corresponds to the construction of the bipolar transistor illustrated in FIG. 2 so that reference is made to this description in order to avoid repetition.

In contrast to the embodiment illustrated in FIG. 2, the bipolar transistor 10 in accordance with FIG. 3 has more than two inner emitter webs 26, so that more than two partial spaces 28 of the emitter inner space 27 are formed as well. The number of partial spaces formed in this way is arbitrary and can be chosen accordingly as required and depending on the application. A base contact 41 is provided in each of the partial spaces 28. In order to emphasize the free variability of the number of partial spaces 28 and of the base contacts 41 situated within, a non-terminated series of base contacts (B1, B2, . . . Bn) 41 is illustrated in FIG. 3.

Figure 4:
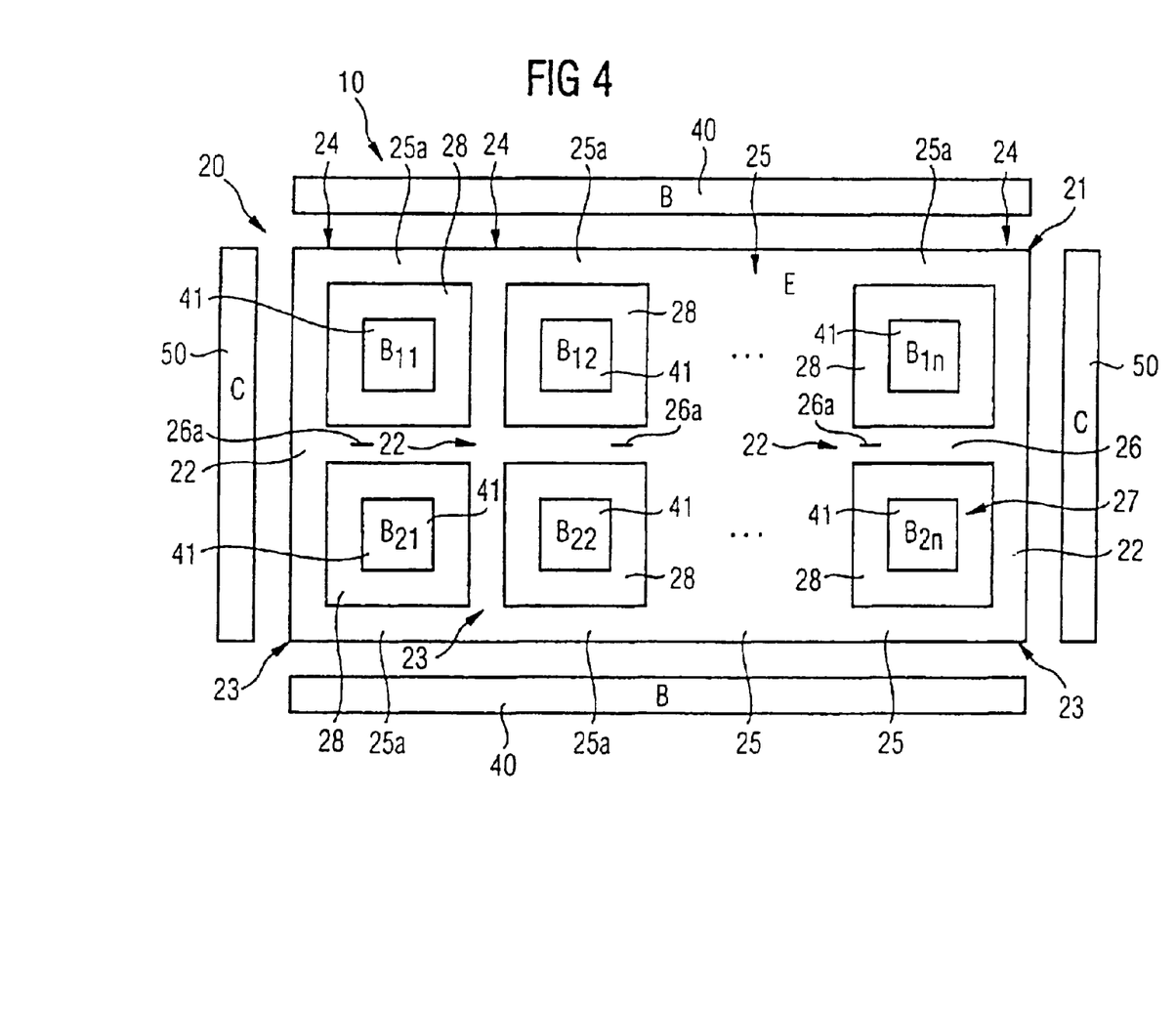
FIG. 4 is a diagrammatic layout of another embodiment of an optimized transistor arrangement according to the present invention.

FIG. 4 illustrates another configurational form of the bipolar transistor 10 according to the invention. The bipolar transistor 10 has an emitter (E) 20 which again has a closed emitter configuration 21. In contrast to the above-described exemplary embodiments, however, more than two strip-type emitter elements 22 are provided which are orientated in parallel and spaced apart with respect to one another. In order to produce a closed emitter configuration 21, the individual emitter strips 21 are connected to one another at their respective free ends 23, 24 via constituent parts 25a of an outer emitter web. The totality of the individual constituent parts 25 forms the outer emitter web 25.

Equally, individual constituent parts 26a of an inner emitter web 26 are provided between the individual constituent parts 25a of the outer emitter web 25. In the example in accordance with FIG. 4, only a single inner emitter web 26 is formed in this way, so that the closed emitter configuration 21 encloses two rows and an arbitrary number of columns of partial spaces 28 in the emitter inner space 27. With the use of a basic configuration as illustrated in FIG. 3, the number of rows can likewise be increased arbitrarily.

The exemplary embodiment illustrated in FIG. 4 has an arbitrary number of columns of partial spaces 28 in which an arbitrary number of base contacts (B11, B12; . . . B1n; B21, B22, . . . B2n) are provided.

The outer emitter webs 25 are in each case flanked by two strip-type base contacts (B) 40. Two strip-type collector contacts (C) 50 are provided adjacent to the respective outer strip-type emitter elements 22.

Figure 5:
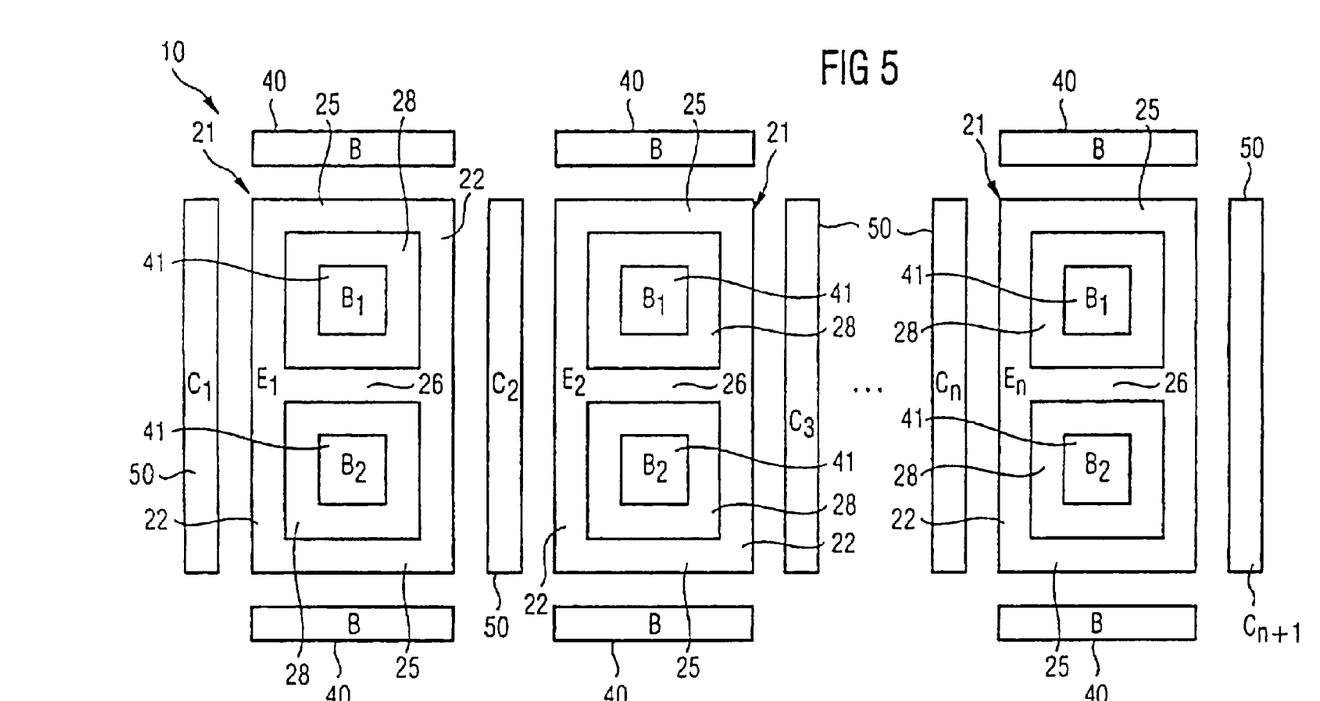
FIG. 5 is a diagrammatic layout of yet another embodiment of an optimized transistor arrangement according to the present invention.

FIG. 5 illustrates a further bipolar transistor 10, which has an emitter (E) 20 with an arbitrary number of closed emitter configurations (E1, E2, . . . En) 21 arranged adjacent to one another. Each emitter configuration 21 has a construction as illustrated in FIG. 2, but could also have any other construction. Outside its outer emitter webs 25, each emitter configuration 21 is flanked by a strip-type base contact (B) 40 in each case. The individual strip-type emitter elements 22 of each emitter configuration 21 are flanked by strip-type collector contacts (C) 50. Respective adjacent emitter configurations 21 can share a single collector contact 50 situated in between. In this way, an emitter 20 with n closed emitter configurations (E1, E2, . . . En) 21 has a total of n+1 collector contacts (C1, C2, . . . Cn, Cn+1) 50.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The particular implementations shown and described herein are illustrative examples of the invention and are not intended to otherwise limit the scope of the invention in any way. For the sake of brevity, the conventional electronics may not be described in detail. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A bipolar transistor, comprising:
   at least one emitter formed from one or more emitter elements, the emitter having at least one closed emitter configuration, the at least one emitter configuration bounding at least one emitter inner space;
   at least two base contacts; and
   at least one collector contact;
   the transistor being configured such that:
      the at least one emitter, the at least two base contacts and the at least one collector contact are provided in a specific arrangement with respect to one another for the formation of the transistor layout;
      at least one of the base contacts is arranged in the emitter inner space and at least one other base contact and also the at least one collector contact are arranged outside the emitter configuration;
      no dedicated base contact is present between the emitter and the collector contact; and
      a base connection is effected between the emitter and the collector contact via base polysilicon material.

2. The bipolar transistor as claimed in claim 1, wherein the emitter configuration comprises two or more emitter elements that are connected to one another.

3. The bipolar transistor as claimed in claim 1, further comprising:
   two or more strip-type emitter elements that are oriented parallel and spaced apart with respect to one another; and
   an emitter element formed as an outer emitter web;
   wherein:
      the emitter configuration comprises the two or more strip-type emitter elements; and
      the strip-type emitter elements are connected to one another at their free ends in each case via the emitter element.

4. The bipolar transistor as claimed in claim 3, wherein at least one further, inner emitter web which connects the two strip-type emitter elements is provided between the two outer emitter webs, via which inner emitter web the emitter inner space is subdivided into two or more partial spaces.

5. The bipolar transistor as claimed in claim 4, further comprising a base contact that is arranged in one or more of the partial spaces.

6. The bipolar transistor as claimed in claim 1, wherein the emitter has two or more closed emitter configurations.

7. The bipolar transistor as claimed in claim 1, wherein at least one of: a) two strip-type base contacts and b) at least two strip-type collector contacts are provided outside the at least one emitter configuration.

8. The bipolar transistor as claimed in claim 7, wherein the strip-type base contacts are oriented parallel and spaced apart with respect to outer emitter webs.

9. The bipolar transistor as claimed in claim 7, wherein the strip-type collector contacts are oriented parallel and spaced apart with respect to two or more strip-type emitter elements that are oriented parallel and spaced apart with respect to one another.

10. The bipolar transistor as claimed in claim 1, wherein the at least one emitter is configured to be connectable in a first metalization plane.

11. The bipolar transistor as claimed in claim 10, wherein the at least one base contact is configured to be led into a second metalization plane lying parallel and spatially spaced apart relative to the first metalization plane.

12. The bipolar transistor as claimed in claim 1, wherein the base polysilicon is embodied as silicide.

13. A method for operating a bipolar transistor at a microwave frequency, comprising utilizing the bipolar transistor according to claim 1.

14. The bipolar transistor as claimed in claim 1, wherein:

the at least one other base contact is a strip-type base contact having a length-defining axis;

the at least one collector contact is a strip-type base contact having a length-defining axis; and the length-defining axis of the at least one other base contact is not parallel to the length-defining axis of the at least one collector contact.

15. The bipolar transistor as claimed in claim 14, wherein the length-defining axis of the at least one other base contact is perpendicular to the length-defining axis of the at least one collector contact.

* * * * *